(12) United States Patent
Jin et al.

(10) Patent No.: US 9,070,598 B2
(45) Date of Patent: Jun. 30, 2015

(54) THIN FILM TRANSISTOR ARRAY PANEL AND ORGANIC LIGHT EMITTING DIODE DISPLAY INCLUDING THE SAME, METHOD FOR CUTTING WIRE IN THIN FILM TRANSISTOR ARRAY PANEL

(75) Inventors: Guang-Hai Jin, Yongin (KR); Jae-Beom Choi, Yongin (KR); Kwan-Wook Jung, Yongin (KR); June-Woo Lee, Yongin (KR); Moo-Jin Kim, Yongin (KR); Se-Hun Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 255 days.

(21) Appl. No.: 13/534,111

(22) Filed: Jun. 27, 2012

(65) Prior Publication Data
US 2013/0187167 A1  Jul. 25, 2013

(30) Foreign Application Priority Data

Jan. 20, 2012 (KR) .......... 10-2012-0006977

(51) Int. Cl.
*H01L 27/32* (2006.01)
*H01L 27/12* (2006.01)
*G02F 1/13* (2006.01)
*G02F 1/1362* (2006.01)

(52) U.S. Cl.
CPC .......... *H01L 27/124* (2013.01); *H01L 27/1244* (2013.01); *G02F 1/1309* (2013.01); *G02F 1/136259* (2013.01); *H01L 27/1259* (2013.01); *H01L 27/3276* (2013.01); *H01L 2251/568* (2013.01)

(58) Field of Classification Search
CPC .............. H01L 27/124; H01L 27/1244; H01L 27/3279; G02F 1/1309; G02F 1/136259
USPC .................................. 349/54, 55; 347/54, 55
See application file for complete search history.

(56) References Cited

U.S. PATENT DOCUMENTS

| | | | | |
|---|---|---|---|---|
| 6,052,162 A | * | 4/2000 | Shimada et al. | 349/38 |
| 2001/0028418 A1 | * | 10/2001 | Ozaki et al. | 349/54 |
| 2007/0120143 A1 | * | 5/2007 | Huh et al. | 257/103 |
| 2011/0096270 A1 | * | 4/2011 | Ahn et al. | 349/84 |

FOREIGN PATENT DOCUMENTS

| | | |
|---|---|---|
| JP | 2002-110345 | 4/2002 |
| KR | 10-2007-0050621 A | 5/2007 |
| KR | 10-2008-0041015 A | 5/2008 |

* cited by examiner

*Primary Examiner* — Yu Chen
(74) *Attorney, Agent, or Firm* — Lee & Morse, P.C.

(57) ABSTRACT

A thin film transistor display panel includes a plurality of pixels arranged in a matrix format, the plurality of pixels include thin film transistors, respectively, a plurality of first signal lines connected with the pixels, a plurality of second signal lines connected with the pixels, the plurality of second signal lines cross the first signal lines in an insulated manner, at least one of the second signal lines includes a cut portion, and an organic repairing member overlaps the cut portion

12 Claims, 8 Drawing Sheets

THIN FILM TRANSISTOR ARRAY PANEL AND ORGANIC LIGHT EMITTING DIODE DISPLAY INCLUDING THE SAME, METHOD FOR CUTTING WIRE IN THIN FILM TRANSISTOR ARRAY PANEL

RELATED APPLICATIONS

Korean Patent Application No. 10-2012-0006977, filed on Jan. 20, 2012, in the Korean Intellectual Property Office, and entitled: "Thin Film Transistor Array Panel and Organic Light Emitting Diode Display Including The Same, Method For Cutting Wire in Thin Film Transistor Array Panel," is incorporated herein by reference in its entirety.

BACKGROUND

An organic light emitting diode display is a self-light emitting display that displays an image by using an organic light emitting diode that emits light. The organic light emitting diode display differs from a liquid crystal display in that it does not require a separate light source. The organic light emitting diode display may have relatively small thickness and weight. The organic light emitting diode display may exhibit quality characteristics such as low power consumption, high luminance, and short response time, and it is spotlighted as a next generation display device for portable electronic appliances.

The above information disclosed in this Background section is only for enhancement of understanding of the background of the described technology and therefore it may contain information that does not form the prior art that is already known in this country to a person of ordinary skill in the art.

SUMMARY

Embodiments may be realized by providing a thin film transistor display panel that includes a plurality of pixels arranged in a matrix format and respectively comprising thin film transistors, a plurality of first signal lines connected with the pixels, a plurality of second signal lines crossing the first signal lines in an insulated manner and connected with the pixels, an organic repairing member overlapping the second signal lines, and the second signal line includes a cut portion and the cut portion overlaps the organic repairing member.

The organic repairing member may be separated in the same shape of the cut portion. The organic repairing member may be a photo-curable organic material. The photo-curable organic material may be one of glycidyl methacrylate, glycol methacrylate, 2-hydroxy-3-phenoxypropylacrylate, and 2-methyl-2-propenoic acid phosphinicobis-(oxy-2,1-ethanediyl)ester.

The cut portion may be arranged in at least one side of both sides of a crossing point where the first signal line and the second signal line cross each other. The first signal line may be applied with a gate voltage and the second signal line may be applied with a data voltage.

The first signal line may be connected with a gate electrode of the thin film transistor and the second signal line may be connected with a drain electrode of the thin film transistor. The thin film transistor display panel may further include a plurality of third signal lines crossing the second signal lines and applied with the same signal applied to the second signal lines and a fourth signal line crossing the first and third signal lines.

The first signal line may be applied with a gate voltage, the second and third signal lines may be applied with a constant voltage, and the fourth signal line may be applied with a data voltage.

The thin film transistor may include a first thin film transistor and a second thin film transistor. The first signal line may be connected with a gate electrode of the first thin film transistor, the fourth signal line may be connected with a source electrode of the first thin film transistor, a drain electrode of the first thin film transistor may be connected with a gate electrode of the second thin film transistor, and the second signal line may be connected with a source electrode of the second thin film transistor.

Embodiments may also be realized by providing a plurality of pixels arranged in a matrix format and including an organic emission layer, a pixel electrode and a common electrode overlapping the organic emission layer, interposing the organic emission layer therebetween, a plurality of first signal lines respectively connected with the pixels, a plurality of second signal lines crossing the first signal lines in an insulated manner and respectively connected with the pixels, an organic repairing member overlapping the second signal line, and the second signal line includes a cut portion and the cut portion overlaps the organic repairing member.

The pixel may include a first thin film transistor connected with the first signal line and a second thin film transistor connected with the second signal line. The pixel electrode may be connected with a drain electrode of the second thin film transistor.

The pixel may include a thin film transistor having a gate electrode connected with the first signal line and a source electrode connected with the second signal line. The organic repairing member may be separated in the same shape of the cut portion.

The organic repairing member may be a photo-curable organic material. The photo-curable organic material may be one of one of glycidyl methacrylate, glycol methacrylate, 2-hydroxy-3-phenoxypropylacrylate, and 2-methyl-2-propenoic acid phosphinicobis-(oxy-2,1-ethanediyl)ester.

The cut portion may be arranged in at least one side of both sides of a crossing portion where the first signal line and the second signal line cross each other.

Embodiments may also be realized by providing a cutting method of a thin film transistor display panel that includes forming signal lines on a substrate, forming an organic repairing member on the signal line, and separating by simultaneously cutting the organic repairing member and the signal line using a laser.

The signal lines may include a first signal line and a second signal line arranged on the substrate and crossing each other in an insulated manner, and the organic repairing member may be formed on a second signal line arranged in at least one side of both sides of the first signal line, centering a crossing point where the first signal line and the second signal line cross each other.

BRIEF DESCRIPTION OF THE DRAWINGS

Features will be come apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Hereinafter, a cutting method using a laser according to an exemplary embodiment will be described with reference to the accompanying drawings.

Figure 1:
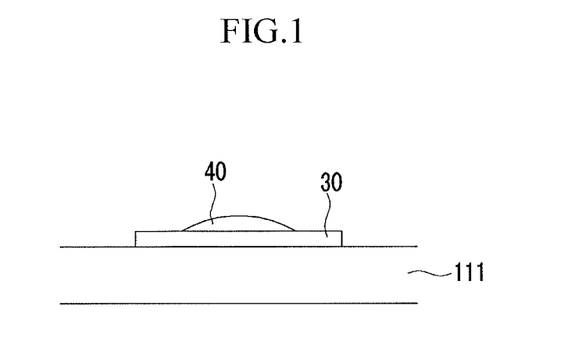
FIG. 1 and FIG. 2 illustrate schematic cross-sectional views provided for description of a method for disconnection using a laser, according to an exemplary embodiment.
Figure 2:
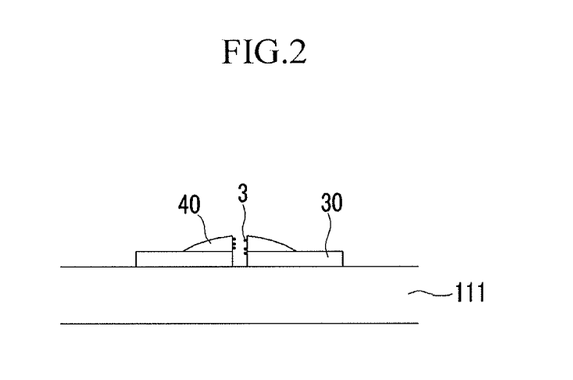

FIG. 1 and FIG. 2 are schematic cross-sectional views provided for description of a cutting (or, opening) method using a laser according to an exemplary embodiment.

Referring to FIG. 1, a signal line 30 is disposed on a substrate 111. The substrate 111 may include a thin film transistor including a thin film transistor of a liquid crystal display or an organic light emitting diode (OLED) display.

The signal line 30 may be a signal line applying an electrical signal, e.g., a data voltage, a constant voltage, and/or the like to a pixel of the substrate 111 including the thin film transistor.

A organic repairing member 40 may be formed on the signal line 30. The organic repairing member 40 may be disposed in a location to be cut (or, to be opened) when cutting the signal line 30 using a laser. In this case, the organic repairing member 40 covers the region where the cut portion will be formed so that the organic repairing member 40 is formed larger than a horizontal width of the cut portion that is to be later formed.

Then, the cutting method using the laser for the substrate including the organic repairing member will be described in further detail with reference to FIG. 1 and FIG. 2.

First, as shown in FIG. 1, the organic repairing member 40 is formed on a portion for repairing the organic repairing member 40, that is, a portion for cutting in the signal line 30.

The organic repairing member 40 may be or may include a photo-curable material cured by UV irradiation. According to an exemplary embodiment, the organic repairing member 40 may be formed of one of glycidyl methacrylate, glycol methacrylate, 2-hydroxy-3-phenoxypropylacrylate, and 2-methyl-2-propenoic acid phosphinicobis-(oxy-2,1-ethanediyl) ester.

The organic repairing member 40 may be formed using a method that is configured to restrict formation of the organic repairing member 40 to a specific portion. For example, an inkjet printing method or a dropper method may be used to form the organic repairing member 40.

In addition, as shown in FIG. 2, the organic repairing member 40 and the signal line 30 are cut, e.g., simultaneously cut, by irradiating a laser beam. In this case, the signal line 30 formed of a metal is cut such that a metal particle 3 may be generated. The metal particle 3 may be a plurality of metal particles 3 remaining in regions surrounding cut portions of the signal line 30 and the organic repairing member 40.

The metal particle 3 may cause a failure such as a leakage current or a short-circuit, e.g., by moving to a metal pattern such as a neighboring pixel electrode or wiring.

However, as in the exemplary embodiment, the laser beam is irradiated after the organic repairing member 40 formed. According, movement of the metal particle 3 toward another metal pattern (and passing through the organic repairing member) may be reduced and/or prevented due to, e.g., the thickness of the organic repairing member 40.

In addition, when the laser beam is irradiated while the organic repairing member 40 is in the half-cured state, the metal particle 3 may be cut by the laser beams and may become attached to a side wall of the exposed organic repairing member 40. Accordingly, movement of the metal particle to, e.g., the neighboring metal pattern may be reduced and/or prevented so that a failure due to the metal particle may be prevented. For example, the organic repairing member 40 may trap the metal particle 3 thereon to so that the metal particle 3 may be restricted from moving to another area. Further, the organic repairing member 40 may be a photo-curable organic material such that the organic repairing member 40 in the half-cured state may be photo-cured by the laser beams during the cutting operation.

The organic repairing member 40 may be used all the display devices that include a metal signal and cuts the same, such as a liquid crystal display and an organic light emitting diode display. The organic light emitting diode display will now be described in detail with reference to FIG. 3 to FIG. 7.

Figure 3:
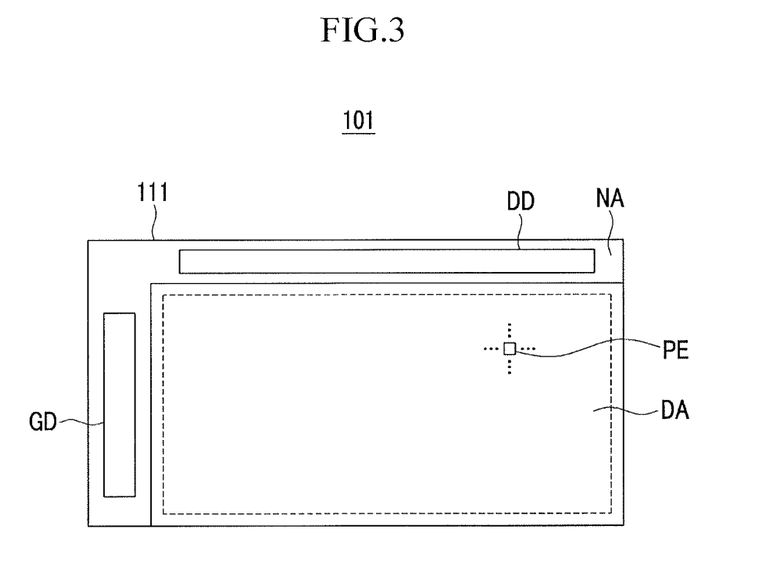
FIG. 3 illustrates a schematic top plan view of a structure of an organic light emitting diode (OLED) display, according to the exemplary embodiment.
Figure 4:
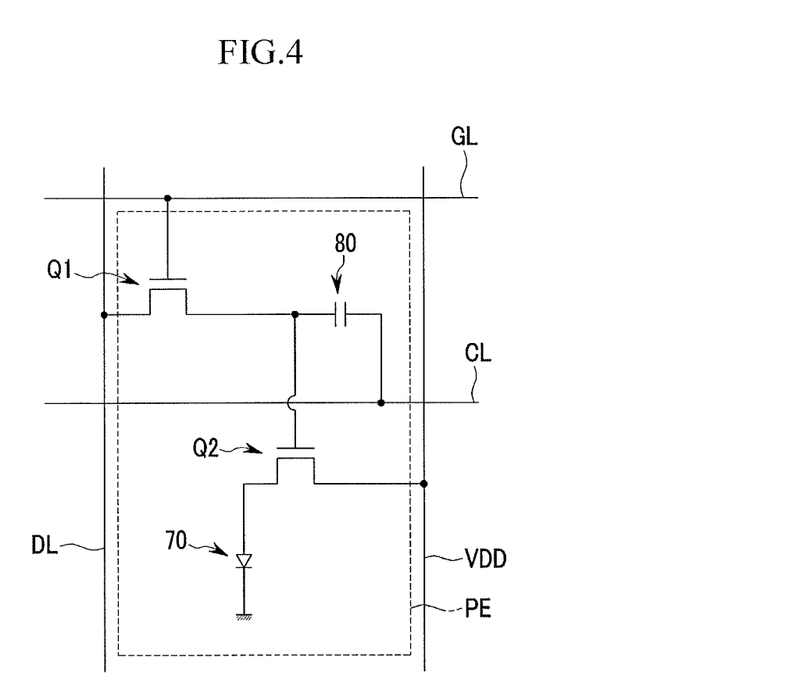
FIG. 4 illustrates a circuit diagram of a pixel circuit of the OLED display of FIG. 3.

FIG. 3 is a schematic top plan view of a structure of the organic light emitting diode display according to the exemplary embodiment, and FIG. 4 is a circuit diagram of a pixel circuit of the organic light emitting diode display of FIG. 3.

As shown in FIG. 3, the organic light emitting diode display includes a substrate main body 111 divided into a display DA and a non-display area NA. A plurality of pixels PX are formed in the display area DA of the substrate main body 111 to display an image and one or more driving circuits GD and DD are formed in the non-display area NA.

As shown in FIG. 4, one pixel PE may have a 2Tr-1Cap structure, e.g., one pixel PE may include two thin film transistors and one capacitor. The pixel PE may include an organic light emitting diode 70, two thin film transistors (TFTs) Q1 and Q2, and a capacitor 80. However, an exemplary embodiment is not limited thereto. The organic light emitting diode display 101 may be variously structured, e.g., three or more thin film transistors and two or more capacitors may be provided at one pixel PE together with a separate wire. The additional thin film transistor and capacitors may form a compensation circuit.

The compensation circuit may improve the uniformity of the organic light emitting diode 70 formed at each pixel PE, and may prevent the image quality from being deviated. The compensation circuit includes two to eight thin film transistors.

Furthermore, the driving circuits GD and DD formed at the non-display area NA of the substrate main body 111 (shown in FIG. 1) may include additional thin film transistors.

The organic light emitting diode 70 includes an anode being a hole injection electrode, a cathode being an electron injection electrode, and an organic emissive layer disposed between the anode and the cathode.

With an exemplary embodiment, one pixel PE includes a first thin film transistor Q1 and a second thin film transistor Q2.

The first thin film transistor Q1 and the second thin film transistor Q2 respectively include gate electrodes, semiconductor layers, source electrodes, and drain electrodes. A semiconductor layer of at least one thin film transistors among the first thin film transistor Q1 and the second thin film transistor Q2 includes a polycrystalline silicon thin film layer doped with an particle. That is, at least one thin film transistor of the first thin film transistor Q1 and the second thin film transistor Q2 is a polysilicon thin film transistor.

FIG. 4 illustrates a gate line GL, a data line DL, and a common power line VDD, and a capacitor line CL. According to an exemplary embodiment, the capacitor line CL may be omitted.

A source electrode of the first thin film transistor Q1 is connected to the data line DL, and a gate electrode of the first thin film transistor Q1 is connected to the gate line GL. In addition, a drain electrode of the first thin film transistor Q1 is connected to the capacitor line CL through the capacitor 80. A node is formed between the drain electrode of the first thin film transistor Q1 and the capacitor 80 so that a gate electrode of the second thin film transistor Q2 is connected thereto. In addition, the common power line VDD is connected to a source electrode of the second thin film transistor Q2 and a drain electrode thereof is connected with the anode of the organic light emitting element 70.

According to an exemplary embodiment, the first thin film transistor Q1 is used as a switching electrode that selects a pixel PE for light emission. When the first thin film transistor Q1 is instantaneously turned on, the capacitor 80 is charged and the amount of charges charged in this case is proportional to a potential of a voltage applied from the data line DL. When a voltage increasing signal is input to the capacitor line CL with one frame cycle while the first thin film transistor Q1 is in the turn-off state, a gate potential of the second thin film transistor Q2, with reference to the potential charged in the capacitor 80, rises according to the voltage that is applied through the capacitor line CL. Then, the second thin film transistor Q2 is turned on when the gate potential exceeds a threshold voltage. Then, the voltage applied to the common power line VDD is applied to the organic light emitting element 70 through the second thin film transistor Q2 and organic light emitting element 70 emits light.

Hereinafter, the organic light emitting diode display according to an exemplary embodiment will be described in further detail with reference to FIG. 5 to FIG. 7.

Figure 5:
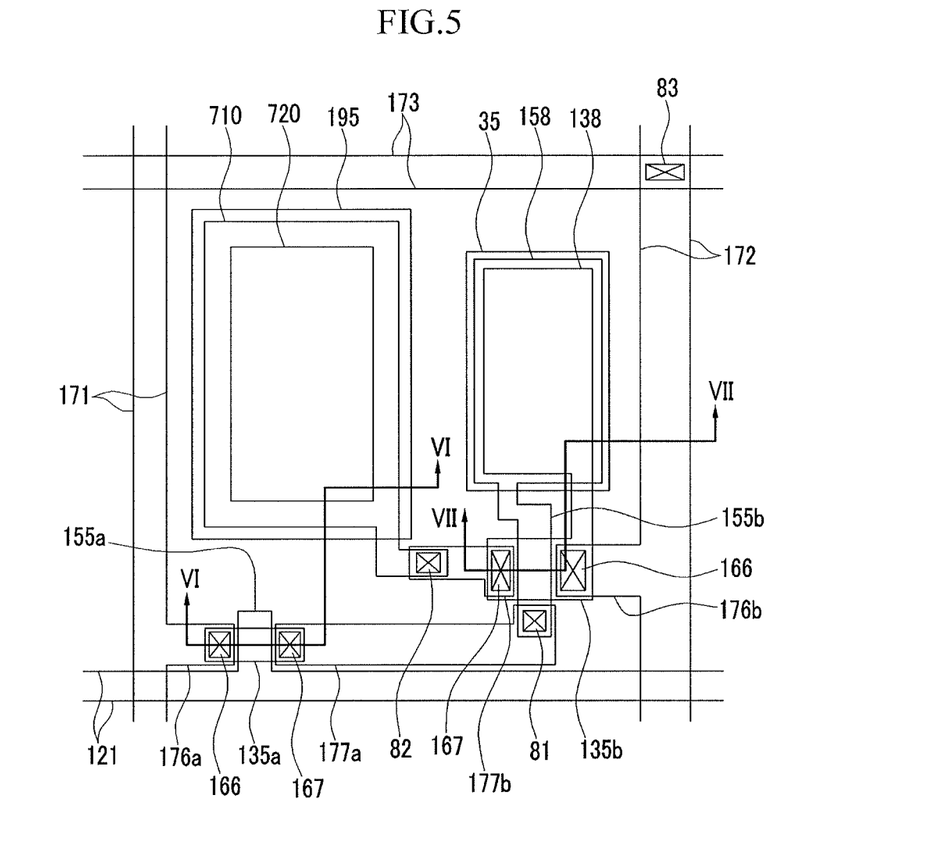
FIG. 5 illustrates a top plan view of the OLED display according to the exemplary embodiment.
Figure 6:
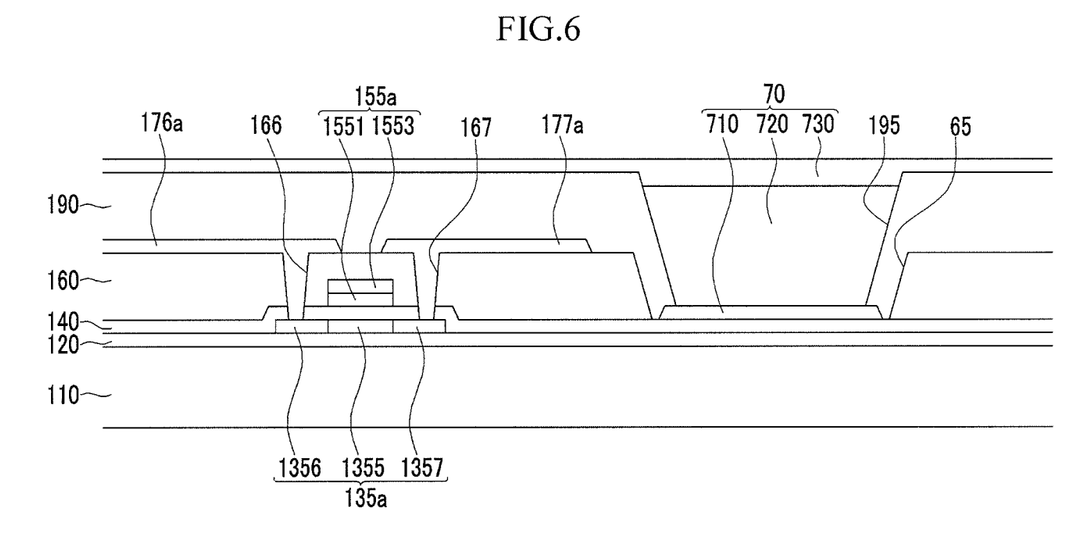
FIG. 6 illustrates a cross-sectional view of FIG. 5, taken along the line VI-VI.
Figure 7:
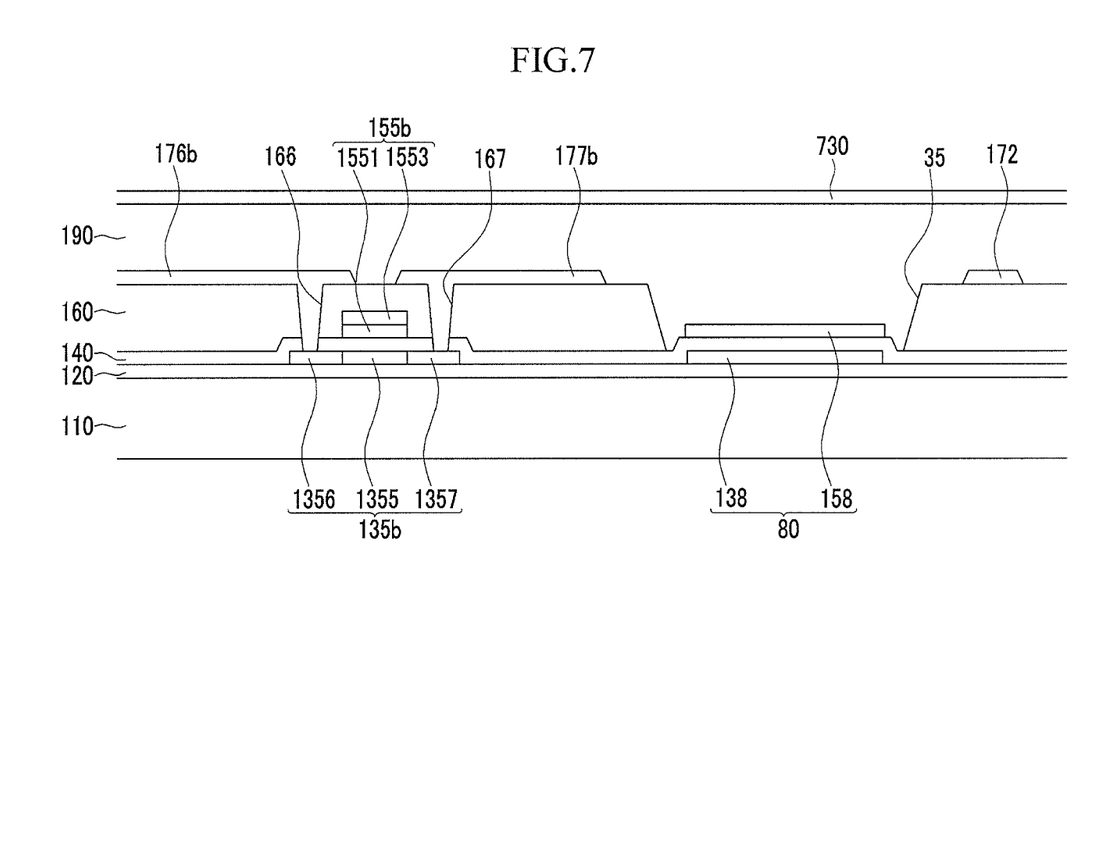
FIG. 7 illustrates a cross-sectional view of FIG. 5, taken along the line VII-VII.

FIG. 5 is a top plan view of the organic light emitting diode display according to the exemplary embodiment, FIG. 6 is a cross-sectional view of FIG. 5, taken along the line VI-VI, and FIG. 7 is a cross-sectional view of FIG. 5, taken along the line VII-VII.

Referring to FIG. 5 to FIG. 7, a buffer layer 120 is formed on the substrate 110.

The substrate 110 may be an insulation material formed of glass, quartz, or plastic, or the substrate 110 may be a metal substrate formed of stainless steel and the like.

The buffer layer 120 may have a single-layered structure of a silicon nitride ($SiN_x$), or a multi-layered structure of a silicon nitride ($SiN_x$) and a silicon oxide ($SiO_2$). The buffer layer 120 has a role in preventing unneeded components like impure elements or moisture from intruding into the target, while flattening the surface thereof at the same time.

First and second semiconductors 135a and 135b, e.g., formed of polycrystalline silicon, and a first capacitor electrode 138 are formed on the buffer layer 120.

Each of the first semiconductor 135a and the second semiconductor 135b is divided into a channel area 1355, a source area 1356, and a drain area 1357. The source area 1356 and the drain area 1357 are formed in both sides, e.g., opposing sides, of the channel area 1355. The channel area 1355 of the first semiconductor 135 may be polycrystalline silicon not doped with particles such as impurities, that is, may be an intrinsic semiconductor. The source area 1356 and the drain area 1357 of the semiconductor 135 may be polycrystalline silicon doped with conductive particles, that is, may be particle semiconductors. The conductive particles may be impurities.

The first capacitor electrode 138 may be doped with a conductive particle.

The particle doped, e.g., the conductive particles, to the source area 1356, the drain area 1357, and the first capacitor electrode 138 may be one of a p-type particle and an n-type particle.

A gate insulation layer 140 is formed on the first semiconductor 135a, the second semiconductor 135b, and the first capacitor electrode 138.

The gate insulation layer 140 may be a single layer or a multiple layer including at least one of a tetra ethyl ortho silicate (TEOS), a silicon nitride, and a silicon oxide.

Referring to FIG. 5, on the gate insulation layer 140, a pixel electrode 710, a gate line 121, a second gate electrode 155b, an auxiliary constant voltage line 173, and a second capacitor electrode 158 are formed.

The gate line 121 is extended in a horizontal direction and transmits a gate signal. The gate line 121 includes a first gate electrode 155a protruding toward the first semiconductor 135a from the gate line 121. The gate line 121 may be spaced apart from the second gate electrode 155b.

The first gate electrode 155a and the second gate electrode 155b respectively overlap the channel area 1355 of the first semiconductor 135a and the channel area 1355 of the second semiconductor 135b.

The first gate electrode 155a and the second gate electrode 155b are formed of a lower metal layer 1551 and an upper metal layer 1553. The lower metal layer 1551 may be formed of a transparent conductive material such as an indium tin oxide (ITO), an indium zinc oxide (IZO), and/or a zinc oxide (ZnO). The upper metal layer 1553 may be formed of a single layer of a multiple layer of tungsten, molybdenum, aluminum, or an alloy thereof.

The second capacitor electrode 158 is connected with the second semiconductor 135b and overlapped with the first capacitor electrode 138. The second capacitor electrode 158 may be formed of the same material as the lower metal layer 1551 of the first gate electrode 155a and/or the second gate electrode 155b.

The first capacitor electrode 138 and the second capacitor electrode 158 may form the capacitor 80 using the gate insulation layer 140 as a dielectric material between the first and second capacitor electrodes 138 and 158.

The pixel electrode 710 is formed of a transparent conductive material which is the same material as the lower metal layer 1551 of the first gate electrode 155a and/or the second gate electrode 155b. The pixel electrode 710 is connected with a drain electrode 177b of the second thin film transistor and thus becomes the anode of the organic light emitting element. The pixel electrode 710 and the first gate electrode 155a may be formed through the same process, and in this case, the pixel electrode 710 is disposed at a level lower than the source or drain electrode relative to the substrate 110.

The auxiliary constant voltage line 173 is separated from the gate line 121 and extended in the same direction of the gate line 121, and transmits a constant voltage.

An interlayer insulation layer 160 is formed on the gate line 121 and the second gate electrode 155b. Like the gate insulation layer 140, the interlayer insulation layer 160 may be formed a tetra ethyl ortho silicate (TEOS), a silicon nitride, and/or a silicon oxide.

Openings 65 and 35 are formed in the interlayer insulation layer 160 to respectively expose the pixel electrode 710 and the capacitor 80. Alternatively, the interlayer insulation layer 160 may cover the capacitor 80 rather than exposing the same. In the interlayer insulation layer 160 and the gate insulation layer 140, a source contact hole 166 exposing the source area 1356, a drain contact hole 167 exposing the drain area 1357, and contact holes 81, 82, and 83 respectively exposing the second gate electrode 155b, the pixel electrode 710, and the auxiliary constant voltage line 173 are formed.

On the interlayer insulation layer 160, a data line 171 having a first source electrode 176a, a constant voltage line 172 having a second source electrode 176b, a first drain electrode 177a, and a second drain electrode 177b are formed.

The data line 171 transmits a data signal and extends in a direction crossing the gate line 121.

The constant voltage line 172 transmits a constant voltage and extends in the same direction of the data line 171 at a distance from the data line 171. The constant voltage line 172 is electrically connected with the auxiliary constant voltage line 173 through the contact hole 83.

The first source electrode 176a protrudes toward the first semiconductor 135a from the data line 171, and the second source electrode 176b protrudes toward the second semiconductor 135b from the constant voltage line 172. The first source electrode 176a and the second source electrode 176b are respectively connected with the source area 1356 through the source contact hole 166.

The first drain electrode 177a faces the first source electrode 176a, the second drain electrode 177b faces the second source electrode 176b, and the first drain electrode 177a and the second drain electrode 177b are respectively connected with the drain area 1357 through the drain contact hole 167.

The first drain electrode 177a is extended along the gate line, and electrically connected with the second gate electrode 155b through the contact hole 81.

The second drain electrode 177b is electrically connected with the pixel electrode 710 through the contact hole 82.

A capacitor electrode (not shown) may be further formed on the interlayer insulation layer 160. The additional capacitor electrode may increase capacitance by being overlapped the first capacitor electrode 138 or the second capacitor electrode 158.

On the first source electrode 176a, the second source electrode 176b, the first drain electrode 177a, and the second drain electrode 177b, the pixel electrode 710 of the organic light emitting element 70 and the pixel defining layer 190 are formed.

The pixel defining layer 190 has an opening 195 exposing the pixel electrode 710. The pixel defining layer 190 may be formed by including a resin such as polyacrylates or polyimides and a silica-based inorganic material.

An organic emission layer 720 is formed in the opening 195 of the pixel defining layer 190.

The organic emission layer 720 may be formed as a multilayer including one or more of a light emission layer, a hole injection layer (HIL), a hole transport layer (HTL), an electron transport layer (ETL), and an electron injection layer (EIL).

If the organic emission layer 720 includes all of them, the electron injection layer is disposed on the negative electrode 710, on which the electron transport layer, the organic emission layer, the hole transport layer, and the hole injection layer may then sequentially stacked.

A common electrode 730 is formed on the pixel defining layer 190 and the organic emission layer 720.

The common electrode 730 becomes the cathode of the organic light emitting element. Thus, the pixel electrode 710, the organic emission layer 720, and the common electrode 730 form the organic light emitting element 70.

The common electrode 730 is formed of a reflective layer, transparent layer, or a semi-transparent layer.

The reflective layer and semi-transparent layer are formed of at least one of magnesium (Mg), silver (Ag), gold (Au), calcium (Ca), lithium (Li), chromium (Cr), and aluminum (Al) or an alloy thereof. The reflective layer and the semi-transparent layer are determined based on a thickness, and the semi-transparent layer may have a thickness of less than or equal to 200 nm. Light transmittance is increased as the thickness is decreased, but resistance is increased when the thickness is too thin.

The transparent layer is formed of a material such as an indium tin oxide (ITO), an indium zinc oxide (IZO), and/or a zinc oxide (ZnO).

A method for repairing a short-circuit between signal lines in the organic light emitting diode display using a laser beam will be described with reference to FIG. 8.

Figure 8:
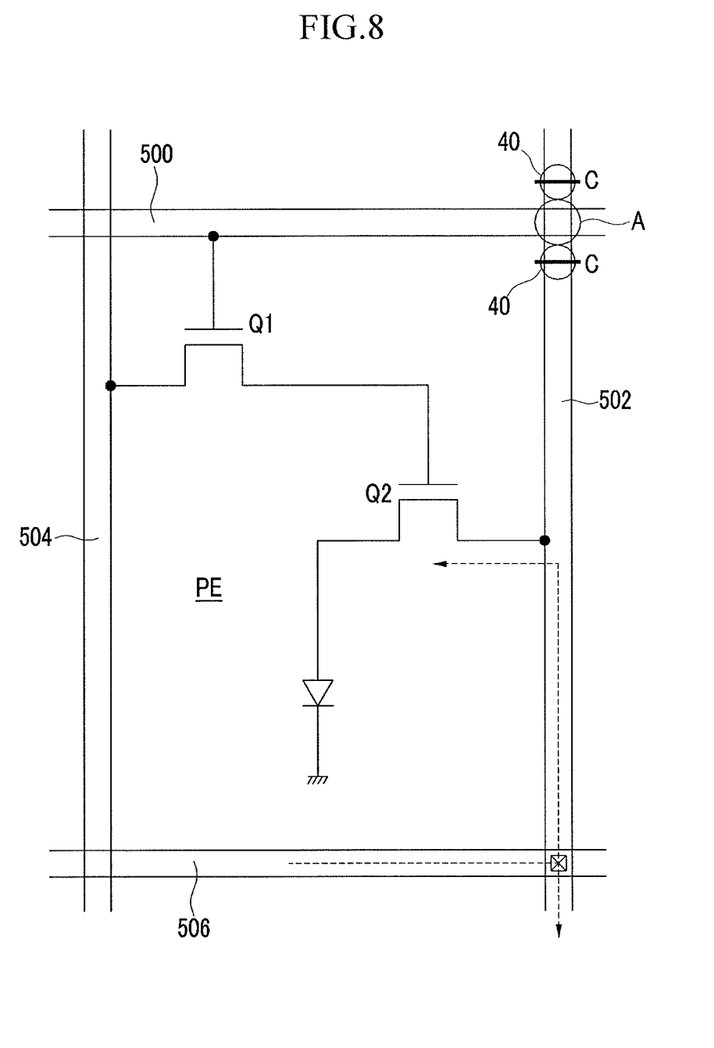
FIG. 8 illustrates a schematic layout view of the OLED display of FIG. 5, according to an exemplary embodiment.

FIG. 8 is a schematic layout view of the organic light emitting diode of FIG. 5 according to the exemplary embodiment.

Referring to FIG. 8, a first signal line 500, a second signal line 502, a third signal line 504, and a fourth signal line 506 are formed on a substrate (not shown).

The first signal line 500 and the third signal line 504 are connected with the first thin film transistor Q1, and the second signal line 502 is connected with the second thin film transistor Q2.

The first signal line 500 may be the gate line 121 of the organic light emitting diode display of FIG. 5, the third signal line 504 may be the data line 171, of the second signal line 502 may be the constant voltage line 172, and the fourth signal line 506 may be the auxiliary constant voltage line 173.

According to an exemplary embodiment, at the crossing portion A, where the first signal line 500 and the second signal line 502 cross each other, there may be a short-circuit state due to, e.g., a failure from a manufacturing process. However, embodiments are not limited thereto, e.g., the short-circuit state may occur at other areas such as where the first signal line 500 crosses the fourth signal line 504. An embodiment of a short-circuit state in the crossing portion A is described below.

In this case, the first signal line 500 and the second signal line 502 may respectively receive not their own signals but signals from different wirings.

Thus, the first signal line 500 and the second signal line 502, e.g., the second signal line as shown in FIG. 2, may be cut using a laser to make the two signal lines receive the desired signals.

In the exemplary embodiment, as shown in FIG. 8, second signal lines 502 disposed at both sides of the crossing portion A is provided with respective organic repairing members 40, e.g., in a manner as illustrated in FIG. 1. Accordingly, a pair of cut portions may be formed having the organic repairing members 40 thereon such that each cut portion is formed on opposing sides of the crossing portion A.

In addition, the organic repairing members 40 and the second signal line 502 are cut together by using the laser to cut the second signal line 502.

As in the exemplary embodiment, the metal particle generated from the second signal line 502 cannot cross the organic repairing member 40 when the laser is irradiated (after the organic repairing member 40 is formed) and accordingly the particle cannot move to the outside (crossing the organic repairing member 40).

In this case, the organic repairing member 40 has the laser applied thereon while the organic repairing member 40 is half-cured, and then the organic repairing member 40 may be cured (further cured) during irradiation of the laser and/or after the irradiation of the laser is finished (e.g., the half-cured organic repairing member 40 may be photo-cured by the irradiation of the laser). For example, the organic repairing member 40 may be irradiated with the laser while in a half-cured state, and then further cured after irradiation of the laser (e.g., the cured process may be completed by the irradiation of the laser). When the laser is irradiated to the organic repairing member 40, metal particles generated from the second signal line 520 may be attached to the side wall of the organic repairing member 40 so that the particles may be prevented from moving to outside areas.

The second signal line 502 and the fourth signal line 506 are arranged in a matrix format and electrically connected with each other through a contact hole. Thus, a constant voltage can be transmitted to the pixel PX through the fourth signal line 506 even through the second signal line 502 is cut.

Hereinafter, a method for repairing a liquid crystal display having a defective pixel using a laser according to an exemplary embodiment will be described with reference to FIG. 9.

Figure 9:
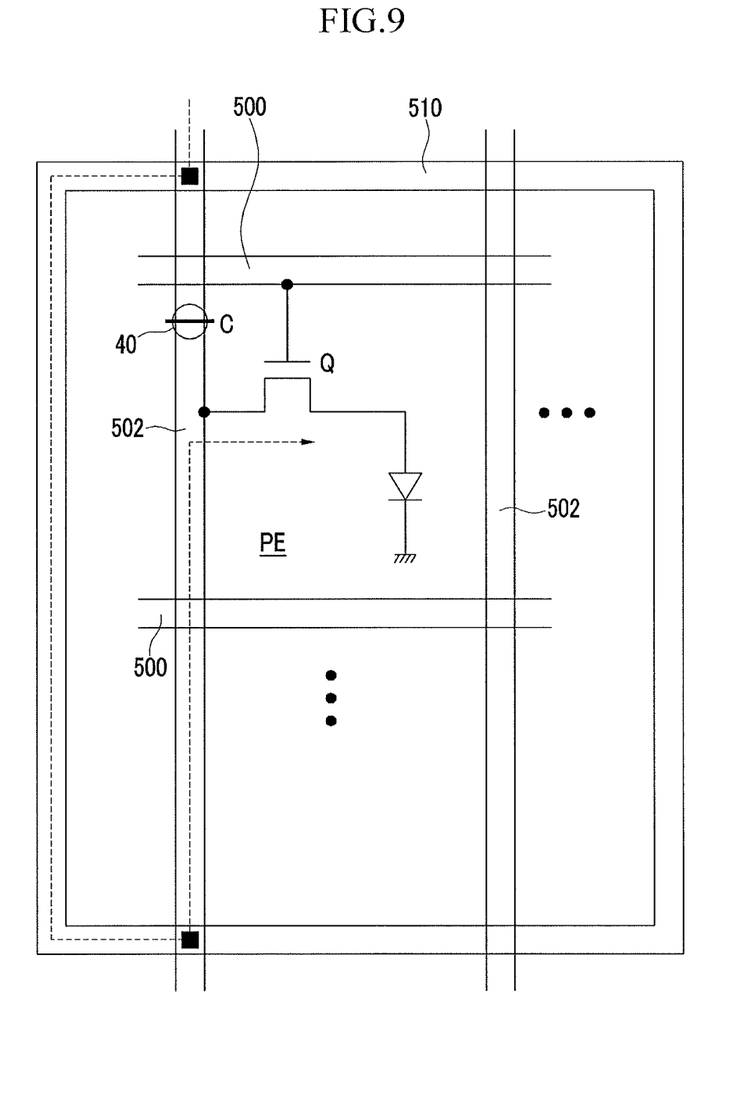
FIG. 9 illustrates a schematic layout view of a liquid crystal display, according to an exemplary embodiment.

FIG. 9 is a schematic layout view of a liquid crystal display according to an exemplary embodiment.

Referring to FIG. 9, a plurality of first signal lines 500 and a plurality of second signal lines 502 are arranged crossing each other on a substrate (not shown).

The first signal line 500 and the second signal line 502 are connected with a thin film transistor Q and the thin film transistor Q is connected with a pixel electrode.

The first signal line 500 may be a gate line transmitting a gate signal to a pixel PE, and the second signal line 502 may be a data line transmitting a data signal to the pixel PE.

The pixel PE of FIG. 9 may be a defective pixel having higher luminance than other pixels. Thus, the defected pixel will be repaired to display a black color setting the pixel not to receive a signal.

For this, as shown in FIG. 1 and FIG. 2, the second signal 502 is cut by cutting the same using a laser such that a data signal is not applied to the pixel. An organic repairing member 40 is formed in an area to be cut and the organic repairing member 40 is cured, e.g., half-cured, using UV, and then the organic repairing member 40 and the lower second signal line 502 are cut together by irradiating a laser such that the organic repairing member 40 and second signal line 502 are cut. When the organic repairing member 40 is formed and then cured, a metal particle generated from the second signal line 520 is attached to the side wall of the organic repairing member 40 and may not be able to cross the organic repairing member 40 so that the metal particle may be prevented from moving to the outside.

In this case, the organic repairing member 40 may be irradiated with the laser while being half-cured, and then cured after irradiation of the laser (e.g., may be cured by the irradiation of the laser). As described, when the laser is irradiated when the organic repairing member 40 is half-cured, the metal particle is attached to the side wall of the organic repairing member 40 so that the metal particle can be prevented from moving to the outside.

When the second signal line 502 is cut, a data signal applied to the pixel PX can be blocked, thereby forming a black pixel. Since the second signal line 502 is cut, the next pixel of the block pixel cannot be applied with a signal.

However, the liquid crystal display includes a repairing line 510 as shown in FIG. 9. Since the repairing line 510 surrounds a pixel, the next pixel of the block pixel can be applied with the data signal by short-circuiting the cut second signal line 520 and the repairing line 510.

The above description relates to repairing a pixel in the liquid crystal display using the repairing line 510, but the pixel can be repaired by forming various types of repairing lines such as a dummy signal line. When the cutting is performed using a laser, the organic repairing member 40 may be formed to prevent and/or reduce the possibility of movement of the metal particle so that a failure due to the metal particle may be minimized.

By way of summation and review, a pixel may become a defective pixel when a wire connected to the pixel is cut or short-circuited. Accordingly, a repair process may be performed on the pixel. For example, a process for cutting a signal line using a laser may be performed. However, due to the process of cutting the signal line, a particle may be generated, e.g., the particle may be a portion that became separated from a conductive layer. When the particle becomes attached to another metal pattern (an outside metal pattern) a leakage current or short-circuit due to electrical connection with the other metal pattern may occur.

In contrast, exemplary embodiments relate to preventing and/or reducing a leakage current and/or a short-circuit (due to a particle) when repairing using a laser and a cutting method for the same. Further, exemplary embodiments relate to a method for cutting a thin film transistor display panel so as to form a cut portion thereon by way of the method for cutting.

For example, a particle from a metal line cut by a laser may be protected and/or prevented from moving to another metal pattern by irradiating the laser after forming an organic repairing member on a region where the cutting operation will be performed. Therefore, a thin film transistor display panel may not experience leakage current or short-circuit due to the metal particle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor display panel, comprising:
   a plurality of pixels arranged in a matrix format, the plurality of pixels including thin film transistors, respectively;
   a plurality of first signal lines connected with the pixels;
   a plurality of second signal lines connected with the pixels, the plurality of second signal lines crossing the first signal lines in an insulated manner, and at least one of the second signal lines including a cut portion; and
   an organic repairing member that overlaps the at least one of the second signal lines at both sides of the cut portion, the organic repairing member having a cut region coextensive with and in a same shape as the cut portion of the at least one of the second signal lines, wherein the organic repairing member is a photo-curable organic material that is one of glycidyl methacrylate, glycol methacrylate, 2-hydroxy-3-phenoxypropylacrylate, and 2-methyl-2-propenoic acid phosphinicobis-(oxy-2,1-ethanediyl)ester.

2. The thin film transistor display panel of claim 1, wherein the at least one of the second signal lines crosses a corresponding at least one of the first signal lines at a crossing point, and the cut portion is arranged adjacent to at least one side of the crossing point.

3. The thin film transistor display panel of claim 1, wherein the first signal lines are applied with a gate voltage and the second signal lines are applied with a data voltage.

4. The thin film transistor display panel of claim 1, wherein the first signal lines are connected with gate electrodes of the thin film transistors and the second signal lines are connected with source electrodes of the thin film transistors.

5. A thin film transistor display panel, comprising:
   a plurality of pixels arranged in a matrix format, the plurality of pixels including thin film transistors, respectively;
   a plurality of first signal lines connected with the pixels;
   a plurality of second signal lines connected with the pixels, the plurality of second signal lines crossing the first signal lines in an insulated manner, and at least one of the second signal lines including a cut portion;
   an organic repairing member that overlaps the at least one of the second signal lines at both sides of the cut portion, the organic repairing member having a cut region coextensive with and in a same shape as the cut portion of the at least one of the second signal lines; and
   a plurality of third signal lines crossing the second signal lines, wherein at least one of the third signal lines is applied with a same signal applied to the at least one of the second signal lines.

6. The thin film transistor display panel of claim 5, further comprising a fourth signal line crossing the first and third signal lines.

7. The thin film transistor display panel of claim 6, wherein the first signal lines are applied with a gate voltage, the second and third signal lines are applied with a constant voltage, and the fourth signal line is applied with a data voltage.

8. The thin film transistor display panel of claim 7, wherein the thin film transistors include a first thin film transistor and a second thin film transistor, one of the first signal lines is connected with a gate electrode of the first thin film transistor, the fourth signal line is connected with a source electrode of the first thin film transistor, a drain electrode of the first thin film transistor is connected with a gate electrode of the second thin film transistor, and one of the second signal lines is connected with a source electrode of the second thin film transistor.

9. An organic light emitting diode display, comprising:
   a plurality of pixels arranged in a matrix format and including an organic emission layer, a pixel electrode and a common electrode overlapping the organic emission layer, the organic emission layer being interposed between the pixel electrode and the common electrode;
   a plurality of first signal lines connected with the pixels;
   a plurality of second signal lines connected with the pixels, the plurality of second signal lines crossing the first signal lines in an insulated manner, and at least one of the second signal lines including a cut portion; and
   an organic repairing member that overlaps the at least one of the second signal lines at the cut portion, the organic repairing member having a cut region coextensive with and in a same shape as the cut portion of the at least one of the second signal lines, wherein the organic repairing member is a photo-curable organic material that is one of glycidyl methacrylate, glycol methacrylate, 2-hydroxy-3-phenoxypropylacrylate, and 2-methyl-2-propenoic acid phosphinicobis-(oxy-2,1-ethanediyl)ester.

10. The organic light emitting diode display of claim 9, wherein:
    each of the pixels includes a first thin film transistor connected with one of the first signal lines and a second thin film transistor connected with one of the second signal lines, and
    the pixel electrode is connected with a drain electrode of the second thin film transistor.

11. The organic light emitting diode display of claim 9, wherein each pixel includes a thin film transistor having a gate electrode connected with one of the first signal lines and a source electrode connected with one of the second signal lines.

12. The organic light emitting diode display of claim 9, wherein the at least one of the second signal lines crosses a corresponding at least one of the first signal lines at a crossing point, and the cut portion is arranged adjacent to at least one side of the crossing point.

* * * * *